United States Patent
Choi et al.

(10) Patent No.: US 9,337,236 B2
(45) Date of Patent: May 10, 2016

(54) LIGHT EMITTING DEVICE HAVING CURRENT BLOCKING LAYER

(71) Applicant: LG INNOTEK CO., LTD., Seoul (KR)

(72) Inventors: Byung Yeon Choi, Seoul (KR); Myeong Soo Kim, Seoul (KR); Hee Young Beom, Seoul (KR); Yong Gyeong Lee, Seoul (KR); Hyun Seoung Ju, Seoul (KR); Gi Seok Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/096,138

(22) Filed: Dec. 4, 2013

(65) Prior Publication Data

US 2014/0159071 A1   Jun. 12, 2014

(30) Foreign Application Priority Data

Dec. 6, 2012   (KR) .......................... 10-2012-0141503

(51) Int. Cl.
*H01L 27/15* (2006.01)
*H01L 33/62* (2010.01)
*H01L 33/14* (2010.01)
*H01L 33/38* (2010.01)

(52) U.S. Cl.
CPC .............. *H01L 27/15* (2013.01); *H01L 27/156* (2013.01); *H01L 33/62* (2013.01); *H01L 33/145* (2013.01); *H01L 33/385* (2013.01); *H01L 2924/0002* (2013.01)

(58) Field of Classification Search
CPC ................................ H01L 33/08; H01L 33/10
USPC ..................................................... 257/13, 88
See application file for complete search history.

(56) References Cited

U.S. PATENT DOCUMENTS

| | | | |
|---|---|---|---|
| 6,711,191 B1 * | 3/2004 | Kozaki et al. | 372/43.01 |
| 2007/0114552 A1 | 5/2007 | Jang et al. | 257/98 |
| 2007/0295952 A1 | 12/2007 | Jang et al. | 257/15 |
| 2010/0059768 A1 | 3/2010 | Hasnain | 257/93 |
| 2010/0078656 A1 | 4/2010 | Seo et al. | 257/88 |
| 2010/0151604 A1 | 6/2010 | Kal et al. | 438/29 |
| 2010/0163887 A1 | 7/2010 | Kim et al. | 257/76 |
| 2010/0237371 A1 | 9/2010 | Kang et al. | 257/98 |
| 2011/0084294 A1 | 4/2011 | Yao | 257/93 |
| 2011/0233564 A1 | 9/2011 | Shen et al. | 257/79 |
| 2012/0187424 A1 * | 7/2012 | Kim et al. | 257/88 |

FOREIGN PATENT DOCUMENTS

EP   1 256 987 A2   11/2002

OTHER PUBLICATIONS

European Search Report dated Mar. 6, 2014 issued in Application No. 13 19 5745.8.

* cited by examiner

*Primary Examiner* — Evan Pert
*Assistant Examiner* — Changhyun Yi
(74) *Attorney, Agent, or Firm* — Ked & Associates, LLP

(57) ABSTRACT

A light emitting device includes a substrate, light emitting cells, each of the light emitting cells including a light emitting structure including lower and upper semiconductor layers, an upper electrode, and a lower electrode, a conductive interconnection layer electrically connecting a lower electrode of a first one of the light emitting cells and an upper electrode of a second one of the light emitting cells, and a current blocking layer disposed to extend from between the upper electrode and the upper semiconductor layer, wherein each light emitting cell further includes a conductive layer arranged to electrically connect the upper electrode of the second light emitting cell to the upper semiconductor layer of the second light emitting cell.

20 Claims, 10 Drawing Sheets

LIGHT EMITTING DEVICE HAVING CURRENT BLOCKING LAYER

CROSS REFERENCE TO RELATED APPLICATION

This application claims priority under 35 U.S.C. §119 to Korean Patent Application No. 10-2012-0141503 filed in Korea on Dec. 6, 2012, which is hereby incorporated in its entirety by reference as if fully set forth herein.

FIELD

Embodiments relate to a light emitting device.

BACKGROUND

Based on the development of metal organic chemical vapor deposition, molecular beam epitaxy, and the like of gallium nitride (GaN), red, green and blue light emitting devices (LEDs) that have high luminance and realize white light have been developed.

Such LEDs do not contain environmentally harmful materials such as mercury (Hg), which is used in existing luminaires, such as incandescent lamps and fluorescent lamps and thus exhibit excellent eco-friendliness, long lifespan, and low power consumption. Thus, these LEDs are replacing conventional light sources. A core competitive factor in such LEDs is to achieve high luminance using chips with high efficiency and high power output and packaging techniques.

To realize high luminance, it is important to increase light extraction efficiency. To increase light extraction efficiency, research into various methods using flip-chip structures, surface texturing, patterned sapphire substrates (PSSs), a photonic crystal technology, anti-reflection layer structures, and the like is underway.

FIG. 1 is a sectional view of a general LED.

Referring to FIG. 1, the LED includes a plurality of light emitting cells D1 and D2, and the light emitting cells D1 and D2 respectively include a substrate 10, light emitting structures 20 and 40, first electrodes 32 and 52, second electrodes 34 and 54, a passivation layer 60, and a metal connection layer 70.

The light emitting structures 20 and 40 respectively include n-type semiconductor layers 22 and 42, active layers 24 and 44, and p-type semiconductor layers 26 and 46 that are disposed on a substrate 10. The metal connection layer 70 electrically connects the first electrode 32 of one (i.e., light emitting cell D1) of the adjacent light emitting cells D1 and D2 to the second electrode 54 of another one (i.e., light emitting cell D2) of the adjacent light emitting cells. In this regard, the passivation layer 60 electrically separates the metal connection layer 70 from the light emitting structure 40 of the light emitting cell D2, electrically separates the adjacent light emitting cells D1 and D2 from each other, and electrically separates the n-type semiconductor layer 22 of the light emitting cell D1 from the metal connection layer 70.

The general LED illustrated in FIG. 1 further requires a separate process for forming the passivation layer 60 and thus manufacturing time and cost of such LEDs increase.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element, and one or more intervening elements may also be present.

When an element is referred to as being 'on' or 'under', 'under the element' as well as 'on the element' can be included based on the element.

Figure 2:
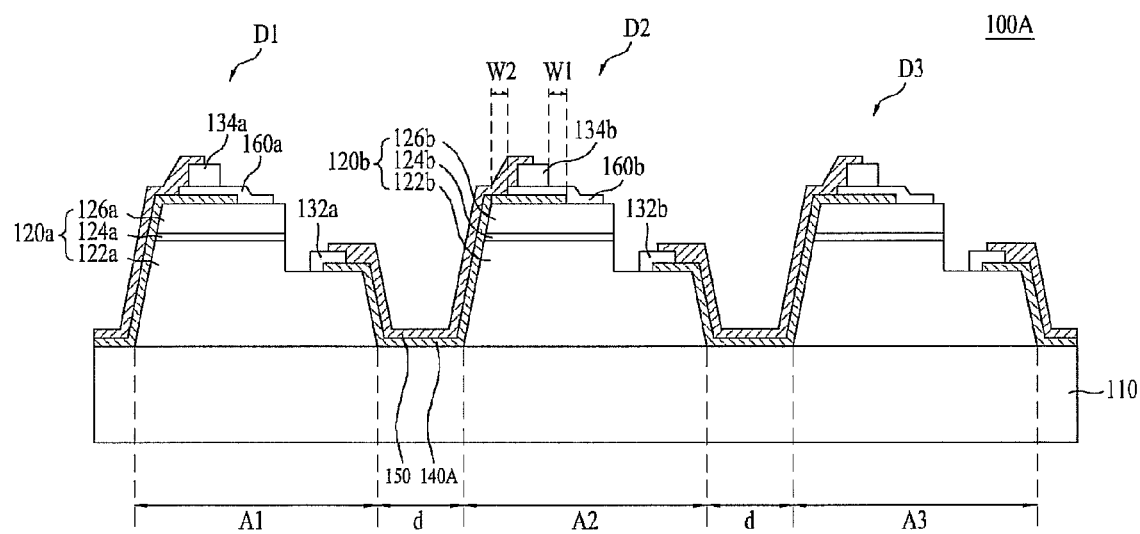
FIG. 2 is a sectional view of a light emitting device according to an embodiment.

FIG. 2 is a sectional view of a light emitting device 100A according to an embodiment of the present invention.

Referring to FIG. 2, the light emitting device 100A includes a substrate 110, a plurality of light emitting cells, e.g., first, second and third light emitting cells D1, D2 and D3, current blocking layers 140A, and conductive interconnection layers 150.

The substrate 110 may be made of a material appropriate for growth of a semiconductor material, e.g., a carrier wafer. In addition, the substrate 110 may be made of a material with excellent thermal conductivity and may be a conductive substrate or an insulating substrate. In addition, the substrate 110 may be made of an optically transmissive material and may have sufficient mechanical strength not to cause bending of the total nitride light emitting structures 120a and 120b of the first, second and third light emitting cells D1, D2 and D3 and to satisfactorily separate into chips through scribing and breaking. For example, the substrate 110 may be made of at least one material selected from sapphire (Al2O3), GaN, SiC, ZnO, Si, GaP, InP, Ga2O3, GaAs, and Ge. The substrate 110 may be provided at an upper surface thereof with an uneven patterned portion. For example, although not shown, the substrate 110 may be a patterned sapphire substrate (PSS).

In addition, a buffer layer (not shown) may be disposed between the substrate 110 and the light emitting structures 120a and 120b. The buffer layer may be formed using a Group III-V compound semiconductor. The buffer layer reduces a difference in lattice constant between the substrate 110 and the light emitting structures 120a and 120b. For example, the buffer layer may include AlN or an undoped nitride, but the disclosure is not limited thereto. The buffer layer may be omitted according to type of the substrate 110 and types of the light emitting structures 120a and 120b.

The first, second and third light emitting cells D1, D2 and D3 are spaced apart from one another on the substrate 110 in a horizontal direction. In this regard, although FIG. 2 illustrates the number of light emitting cells as being three, i.e., the first, second and third light emitting cells D1, D2 and D3, the disclosure is not limited thereto and the number of light emitting cells may be two or at least four. That is, the following disclosure may be applied in cast that the number of light emitting cells is two or at least four.

The first light emitting cell D1 is disposed in a first region A1 of the substrate 110, the second light emitting cell D2 is disposed in a second region A2 of the substrate 110, and the third light emitting cell D3 is disposed in a third region A3 of the substrate 110. The first and second light emitting cells D1 and D2 that are adjacent are spaced a constant distance d apart from each other, and the second and third light emitting cells D2 and D3 are spaced the constant distance d apart from each other. For example, the distance d may be between 2 μm and 7 μm, for example, 5 μm.

The first and second light emitting cells D1 and D2 respectively include, on the substrate 110, the light emitting structures 120a and 120b, lower electrodes 132a and 132b, upper electrodes 134a and 134b, and conductive layers 160a and 160b.

The light emitting structures 120a and 120b respectively include lower semiconductor layers 122a and 122b, active layers 124a and 124b, and upper semiconductor layers 126a and 126b that are sequentially disposed on the substrate 110. The lower semiconductor layers 122a and 122b and the upper semiconductor layers 126a and 126b may be of different conductive types.

The lower semiconductor layers 122a and 122b may be respectively disposed between the substrate 110 and the active layer 124a and between the substrate 110 and the active layer 124b. In addition, the lower semiconductor layers 122a and 122b may include a semiconductor compound, be formed using a Group III-V or II-VI compound semiconductor, and be doped with a first conductive type dopant. For example, the lower semiconductor layers 122a and 122b may include at least one of a semiconductor material having the formula of $Al_xIn_yGa_{(1-x-y)}N$, wherein $0 \leq x \leq 1$, $0 \leq y \leq 1$, and $0 \leq x+y \leq 1$, InAlGaN, AlGaAs, GaP, GaAs, GaAsP, or AlGaInP. The lower semiconductor layers 122a and 122b may be a first conductive type semiconductor layer. When the lower semiconductor layers 122a and 122b are n-type semiconductor layers, the first conductive type dopant may be an n-type dopant such as Si, Ge, Sn, Se, Te, or the like. The lower semiconductor layers 122a and 122b may have a single layer structure or a multilayer structure, but the disclosure is not limited thereto.

The active layers 124a and 124b may be respectively disposed between the lower semiconductor layer 122a and the upper semiconductor layer 126a and between the lower semiconductor layer 122b and the upper semiconductor layer 126b and may include any one of a single well structure, a double hetero structure, a multi-well structure, a single quantum well structure, a multi quantum well (MQW) structure, a quantum dot structure, and a quantum wire structure. The active layers 124a and 124b may be formed using a Group III-V or II-VI compound semiconductor and may have at least one pair structure of a well layer/a barrier layer, e.g., of InGaN/GaN, InGaN/InGaN, GaN/AlGaN, InAlGaN/GaN, GaAs(InGaAs)/AlGaAs, and GaP(InGaP)/AlGaP, but the disclosure is not limited thereto. The well layer may be formed of a material having a lower energy band gap than that of the barrier layer.

The upper semiconductor layers 126a and 126b are disposed on the active layers 124a and 124b, respectively and may include a semiconductor compound. The upper semiconductor layers 126a and 126b may be formed of a semiconductor compound, for example, a Group III-V semiconductor compound, a Group II-VI semiconductor compound, or the like. For example, the upper semiconductor layers 126a and 126b may include a semiconductor material having the formula of $In_xAl_yGa_{1-x-y}N$ where $0 \leq x \leq 1$, $0 \leq y \leq 1$, and $0 \leq x+y \leq 1$, or at least one of AlInN, AlGaAs, GaP, GaAs, GaAsP, or AlGaInP.

Unlike the lower semiconductor layers 122a and 122b as a first conductive type semiconductor layer, the upper semiconductor layers 126a and 126b may be a second conductive type semiconductor layer and be doped with a second conductive type dopant. When the upper semiconductor layers 126a and 126b are of a p-type, the second conductive type dopant may be a p-type dopant such as Mg, Zn, Ca, Sr, Ba, or the like. The upper semiconductor layers 126a and 126b may have a single layer structure or a multilayer structure, but the disclosure is not limited thereto.

The lower semiconductor layers 122a and 122b may be of an n-type and the upper semiconductor layers 126a and 126b are of a p-type. In another embodiment, the lower semiconductor layers 122a and 122b may be of a p-type and the upper semiconductor layers 126a and 126b may be of an n-type. Accordingly, the light emitting structures 120a and 120b may include at least one of an n-p junction structure, a p-n junction structure, an n-p-n junction structure, or a p-n-p junction structure.

The lower electrodes 132a and 132b are disposed on the lower semiconductor layers 122a and 122b, respectively, and the upper electrodes 134a and 134b are disposed above the upper semiconductor layers 126a and 126b, respectively. To dispose the lower electrodes 132a and 132b on the respective lower semiconductor layers 122a and 122b, the lower semiconductor layers 122a and 122b of the respective light emitting structures 120a and 120b may be partially exposed. That is, the upper semiconductor layers 126a and 126b, the active layers 124a and 124b, and the lower semiconductor layers 122a and 122b may be partially etched by mesa etching to partially expose the lower semiconductor layers 122a and 122b. In this regard, exposed surfaces of the lower semiconductor layers 122a and 122b may be disposed lower than lower surfaces of the active layers 124a and 124b. The upper electrodes 134a and 134b and the lower electrodes 132a and 132b will be described below in more detail with reference to FIG. 4.

Meanwhile, a portion of the current blocking layer 140A is disposed between the upper electrode 134b and the upper semiconductor layer 126b of each light emitting cell, e.g., the second light emitting cell D2. The current blocking layer 140A facilitates diffusion of carriers towards the active layer 124b from the upper electrode 134b and thus contributes to enhancement of luminous intensity of the active layer 124b.

It is assumed that the upper electrode 134b of the second light emitting cell D2 has a lower surface facing the upper semiconductor layer 126b of the second light emitting cell D2 and the current blocking layer 140A disposed between the upper electrode 134b and the upper semiconductor layer 126b of the second light emitting cell D2 has an upper surface facing the upper electrode 134b. In this regard, for the current blocking layer 140A to perform diffusion of carriers as described above, an area of the upper surface of the current blocking layer 140A disposed on the upper semiconductor layer 126b may be equal to or greater than an entire area of the lower surface of the upper electrode 134b. That is, in a cross-section illustrated in FIG. 2, a width W1 may be 0 or greater. For this operation, the current blocking layer 140A may be formed of an insulating material such as silicon oxide (SiO2).

In each light emitting cell (e.g., the first and second light emitting cells D1 and D2), the conductive layers 160a and 160b are disposed so as to extend from between the respective upper electrodes 134a and 134b and the current blocking layer 140A to on the respective upper semiconductor layers 126a and 126b and thus electrically connect the respective upper electrodes 134a and 134b to the respective upper semiconductor layers 126a and 126b.

The conductive layers 160a and 160b reduce total reflection and are highly optically transmissive and thus may increase extraction efficiency of light having been emitted from the active layers 124a and 124b and passed through the upper semiconductor layers 126a and 126b. The conductive layers 160a and 160b may be formed as a single layer or multiple layers using at least one of oxide-based materials that have high transmittance with respect to luminescence wavelengths and are transparent, e.g., indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrOx, RuOx, RuOx/ITO, Ni, Ag, Ni/IrOx/Au, or Ni/IrOx/Au/ITO.

Areas of the conductive layers 160a and 160b disposed on the respective upper semiconductor layers 126a and 126b may be equal to or less than the area of the upper surface of each of the upper semiconductor layers 126a and 126b. Accordingly, as illustrated in FIG. 2, a width W2 may be 0 or greater.

The conductive interconnection layer 150 connects adjacent ones (e.g., the first and second light emitting cells D1 and D2) of the first, second and third light emitting cells D1, D2 and D3 to each other. That is, the conductive interconnection layer 150 electrically connects the lower electrode 132a of one (i.e., the first light emitting cell D1) of the two adjacent light emitting cells (D1 and D2) to the upper electrode 134b of another thereof, i.e., the second light emitting cell D2. As illustrated in FIG. 2, the first and second light emitting cells D1 and D2 may be electrically connected in series by the conductive interconnection layer 150, but the disclosure is not limited thereto. That is, the first and second light emitting cells D1 and D2 may be electrically connected in parallel to each other by the conductive interconnection layer 150.

The conductive interconnection layer 150 may have the same or different structure as that of the lower electrodes 132a and 132b and/or the upper electrodes 134a and 134b or may be formed of the same or different materials as those of the lower electrodes 132a and 132b and/or the upper electrodes 134a and 134b. In addition, the conductive interconnection layer 150 may have the same or different thickness as that of the lower electrodes 132a and 132b and/or the upper electrodes 134a and 134b. The conductive interconnection layer 150 may include at least one of Cr, Rd, Au, Ni, Ti, or Pt, but the disclosure is not limited thereto.

Figure 1:
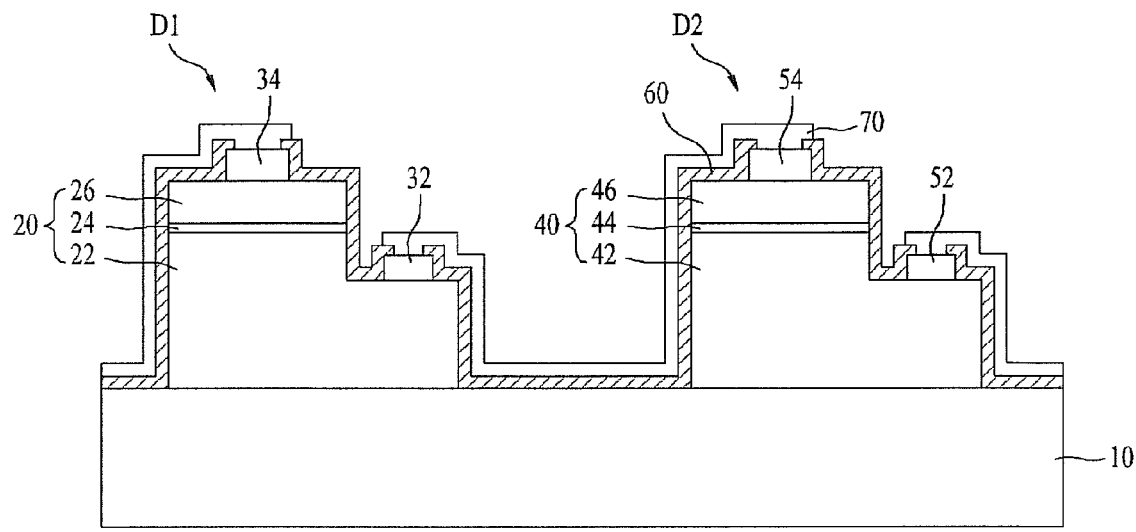
FIG. 1 is a sectional view of a general light emitting device.

According to the present embodiment, the current blocking layer 140A may be disposed so as to extend from between the upper electrode 134b and the upper semiconductor layer 126b of each light emitting cell (e.g., the second light emitting cell D2) to between the adjacent light emitting cells (e.g., the first and second light emitting cells D1 and D2) and the conductive interconnection layer 150. That is, the current blocking layer 140A may be disposed between the lower semiconductor layer 122a of the first light emitting cell D1 and the conductive interconnection layer 150, between the substrate 110 and the conductive interconnection layer 150, and between the light emitting structure 120b of the second light emitting cell D2 and the conductive interconnection layer 150. Thus, it can be confirmed that the current blocking layer 140A illustrated in FIG. 2 serves as the passivation layer 60 illustrated in FIG. 1. For this operation, as described above, the current blocking layer 140A may be formed of an insulating material.

As described above, while the LED illustrated in FIG. 1 includes the separate passivation layer 60, in the light emitting device 100A according to the present embodiment the current blocking layer 140A may serve as the passivation layer 60. That is, the current blocking layer 140A may perform its characteristic function as a current blocking layer and also serve as the passivation layer 60. Accordingly, manufacturing cost may be reduced and manufacturing time may be reduced.

Figure 3:
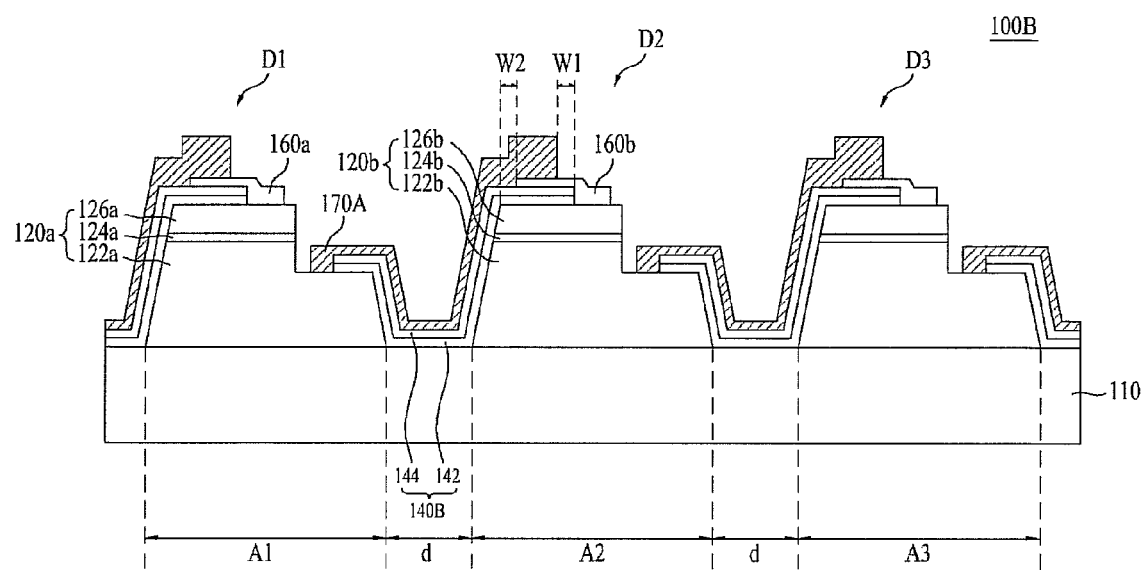
FIG. 3 is a sectional view of a light emitting device according to another embodiment.

FIG. 3 is a sectional view of a light emitting device 100B according to another embodiment.

Although FIG. 2 illustrates the current blocking layer 140A of the light emitting device 100A as a single layer, as illustrated in FIG. 3, a distributed Bragg reflector (DBR) may be formed as a current blocking layer 140B. A DBR refers to a layer with high reflectance formed by alternately stacking at least two insulating layers having different indexes of refraction. The DBR 140B has a reflectance that is greater than that of a reflection layer having a reflectance of 90% or less, e.g., 98% and thus may more satisfactorily serve as a reflection layer.

Although FIG. 3 illustrates that first and second layers 142 and 144 having different indexes of refraction are alternately stacked once, the number of times of stacking may be at least two.

The first layer 142 may be a layer with a low index of refraction and be formed of, for example, silicon oxide (SiO2) having an index of refraction of 1.4 or aluminum oxide (Al2O3) having an index of refraction of 1.6. In addition, the second layer 144 may be a layer with a high index of refraction and be formed of, for example, silicon nitride (Si3N4) having an index of refraction of 2.05 to 2.25, titanium nitride (TiO2) having an index of refraction of 2 or greater, or Si—H having an index of refraction of 3 or greater.

In addition, each of the first and second layers 142 and 144 of the DBR 140B may have a thickness of $\lambda/(4n)$. In this regard, $\lambda$ denotes a wavelength of light emitted from the active layer 124b, and n denotes an index of refraction of the corresponding layer.

In addition, in the light emitting device 100A illustrated in FIG. 2, the lower electrode 132a of one (e.g., the first light emitting cell D1) of adjacent ones (e.g., D1 and D2) of the light emitting cells, the upper electrode 134b of another of the adjacent light emitting cells (e.g., the second light emitting cell D2), and the conductive interconnection layer 150 electrically connecting the first light emitting cell D1 to the second light emitting cell D2 are separately formed. In another embodiment, as illustrated in FIG. 3, the conductive interconnection layer 150, the lower electrode 132a of the first light emitting cell D1, and the upper electrode 134b of the second light emitting cell D2 may be formed as an integration layer 170A.

Assuming that the integration layer 170A has a lower surface facing the upper semiconductor layer 126b on an upper portion of the second light emitting cell D2, and the current blocking layer 140B disposed between the integration layer 170A and the upper semiconductor layer 126b has an upper surface facing the integration layer 170A, an area of the upper surface of the current blocking layer 140B may be equal to or greater than an entire area of the lower surface of the integration layer 170A. Such configuration is provided such that, as illustrated in FIG. 3, when the upper electrode 134b of the second light emitting cell D2 and the conductive interconnection layer 150 are formed as the integration layer 170A, the current blocking layer 140B disposed between the integration layer 170A and the upper semiconductor layer 126b may more satisfactorily diffuse carriers supplied to the active layer 124b from the integration layer 170A and thus block current, as described above.

The light emitting device 100B illustrated in FIG. 3 includes the same elements as those of the light emitting device 100A illustrated in FIG. 2, except that the light emitting device 100B has the above-described different configuration, and thus, a detailed description thereof will be omitted herein.

Figure 4:
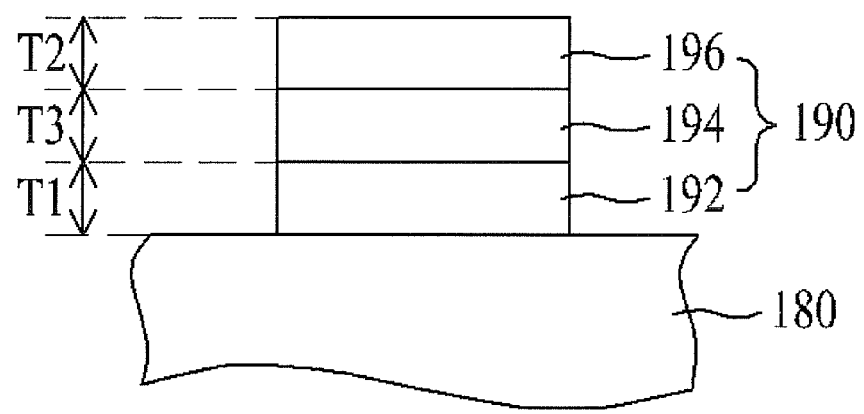
FIG. 4 is a sectional view illustrating at least one of lower electrodes, upper electrodes, a conductive interconnection layer, or an integration layer that is illustrated in FIG. 2 or 3.

FIG. 4 is a sectional view illustrating at least one of the lower electrodes 132a and 132b, the upper electrodes 134a and 134b, the conductive interconnection layer 150, or the integration layer 170A that are illustrated in FIG. 2 or 3.

If a layer 190 illustrated in FIG. 4 corresponds to the lower electrodes 132a and 132b, a base layer 180 corresponds to the lower semiconductor layers 122a and 122b. If the layer 190 corresponds to the upper electrodes 134a and 134b, the base layer 180 corresponds to the conductive layers 160a and 160b. If the layer 190 corresponds to the conductive interconnection layer 150 or the integration layer 170A, the base layer 180 corresponds to the current blocking layers 140A and 140B.

Referring to FIG. 4, the layer 190 may include an adhesive layer 192 and a bonding layer 196 that overlap each other. That is, the adhesive layer 192 may be disposed on the base layer 180, and the bonding layer 196 may be disposed on the adhesive layer 192. In this regard, a reflection layer (not shown) may or may not be disposed between the adhesive layer 192 and the bonding layer 196.

The adhesive layer 192 may include a material in ohmic contact with the base layer 180. For example, the adhesive layer 192 may be formed as a single layer or multiple layers using at least one material selected from Cr, Rd, and Ti. In addition, the adhesive layer 192 may have a thickness T1 of at least 5 nm to 15 nm. For example, the adhesive layer 192 may have a thickness T1 of 2 nm to 10 nm.

In addition, the bonding layer 196 may contact the adhesive layer 192. In another embodiment, as illustrated in FIG. 4, when a barrier layer 194 is disposed between the adhesive layer 192 and the bonding layer 196, the bonding layer 196 may be disposed on the barrier layer 194. The bonding layer 196 may include Au and have a thickness T2 of 100 nm to 180 nm, for example, 140 nm.

The layer 190 may further include the barrier layer 194 disposed between the adhesive layer 192 and the bonding layer 196, but the barrier layer 194 may be omitted. The barrier layer 194 may be disposed to contact the adhesive layer 192 and the bonding layer 196.

The barrier layer 194 may be formed as a single layer or multiple layers using at least one material selected from Ni, Cr, Ti, and Pt. For example, the barrier layer 194 may be formed of a Cr—Pt alloy. In addition, the barrier layer 194 may have a thickness T3 of 200 nm to 300 nm, for example, 250 nm.

In a case in which the layer 190 corresponds to the upper electrodes 134a and 134b, when a reflection layer is disposed between the adhesive layer 192 and the barrier layer 194, the reflection layer reflects light emitted from the active layers 124a and 124b and thus may reduce the amount of light absorbed by a metal of the layer 190. When the reflection layer is disposed between the adhesive layer 192 and the barrier layer 194, however, the bonding layer 196 formed of Au and the reflection layer formed of Al, with the barrier layer 194 formed of Ni disposed therebetween may undergo inter-diffusion.

In addition, to obtain sufficient reflectance, the reflection layer may generally have a thickness of 50 nm to 300 nm. Due to the presence of a thick reflection layer, the adhesive layer 192 has a relatively small thickness, e.g., 2 nm, and thus, adhesion between the layer 190 and the light emitting structures 120a and 120b may be reduced.

When a reflection layer is not disposed between the adhesive layer 192 and the bonding layer 196, however, the thickness of the adhesive layer 192 may be increased by a thickness of the omitted reflection layer and the bonding layer 196, and thus, adhesion between the layer 190 and the base layer 180 may be increased and inter-diffusion between the reflection layer and the bonding layer 196 does not occur. In this regard, the adhesive layer 192 may have a thickness T1 of 2 nm or greater.

In addition, when the above-described light emitting devices 100A and 100B are used for illumination, Al constituting the reflection layer may corrode. Thus, when such a reflection layer is not used, problems such as corrosion of the reflection layer do not occur and thus the light emitting devices 100A and 100B may be used for exterior illumination.

Figure 5:
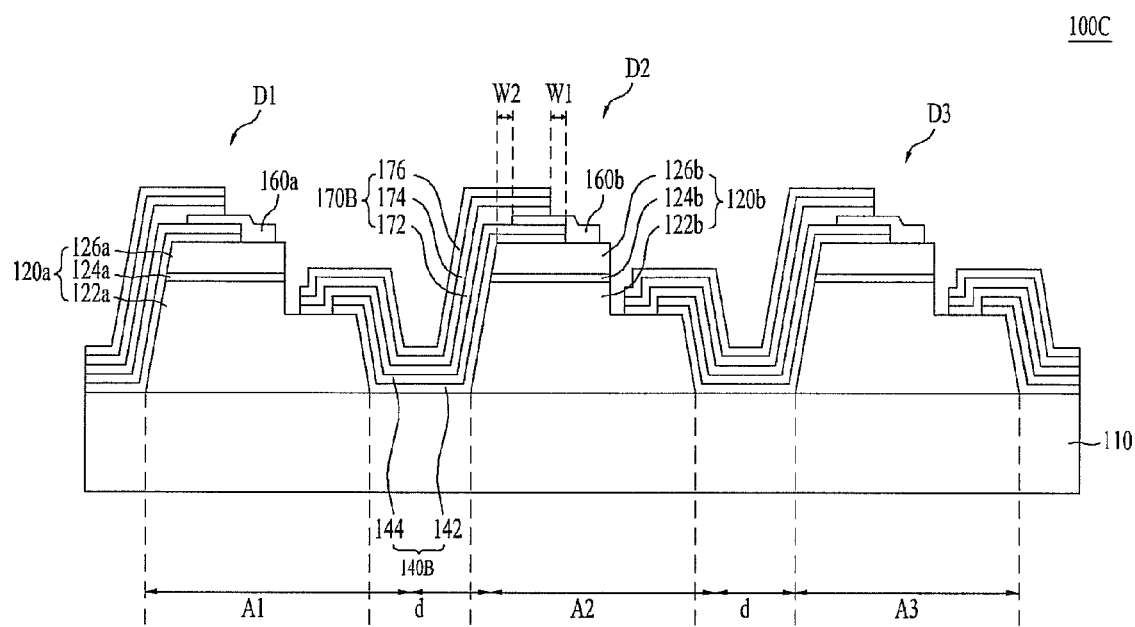
FIG. 5 is a sectional view of a light emitting device according to another embodiment.

FIG. 5 is a sectional view of a light emitting device 100C according to another embodiment.

While the integration layer 170A of the light emitting device 100B of FIG. 3 is formed as a single layer, an integration layer 170B of the light emitting device 100C illustrated in FIG. 5 may include an adhesive layer 172, a barrier layer 174, and a bonding layer 176. Except for this difference, the light emitting device 100C of FIG. 5 includes the same elements as those of the light emitting device 100B of FIG. 3 and thus a detailed description thereof will be omitted herein. The adhesive layer 172, the barrier layer 174, and the bonding layer 176 illustrated in FIG. 5 respectively correspond to the adhesive layer 192, the barrier layer 194, and the bonding layer 196 illustrated in FIG. 4 and thus a detailed description thereof will be omitted herein. In the present embodiment of FIG. 5, the barrier layer 174 of the integration layer 170B may be omitted.

Figure 6:
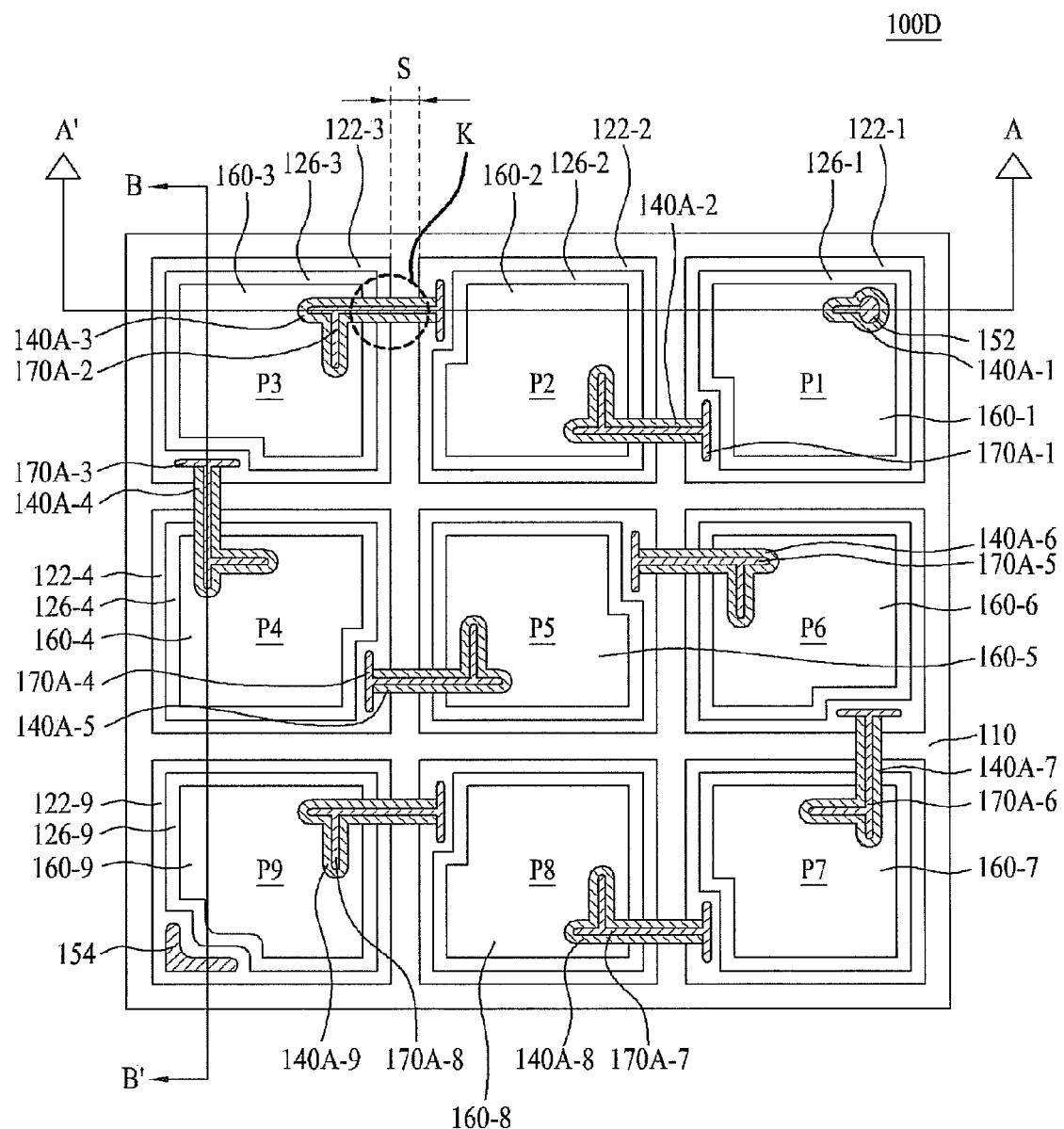
FIG. 6 is a plan view of a light emitting device according to another embodiment.
Figure 7:
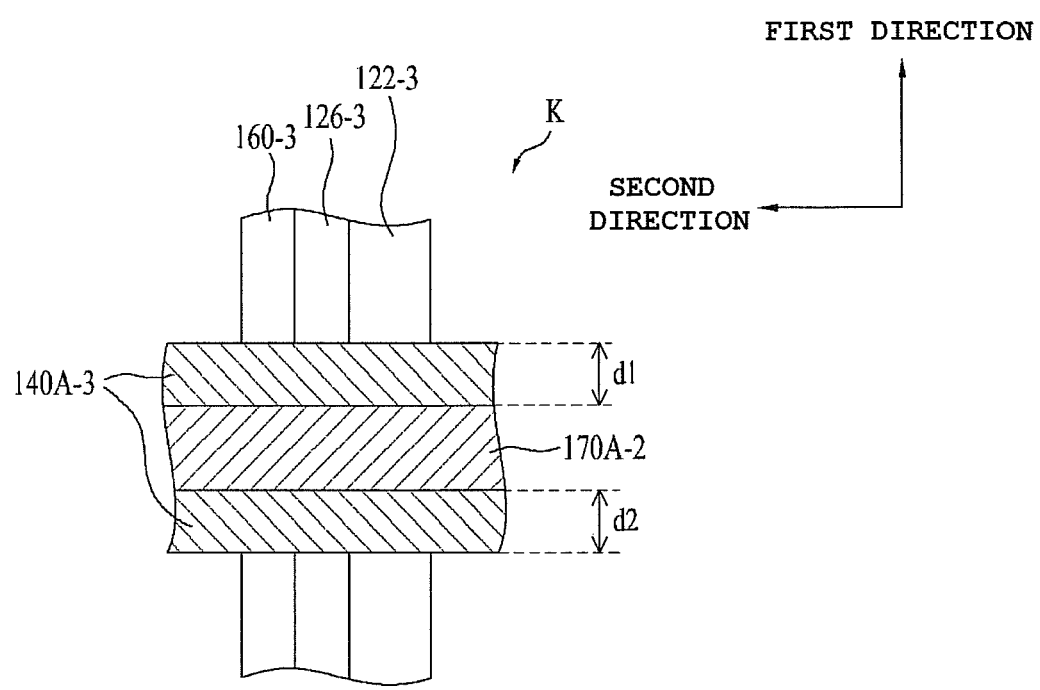
FIG. 7 is an enlarged view of portion 'K' illustrated in FIG. 6.
Figure 8:
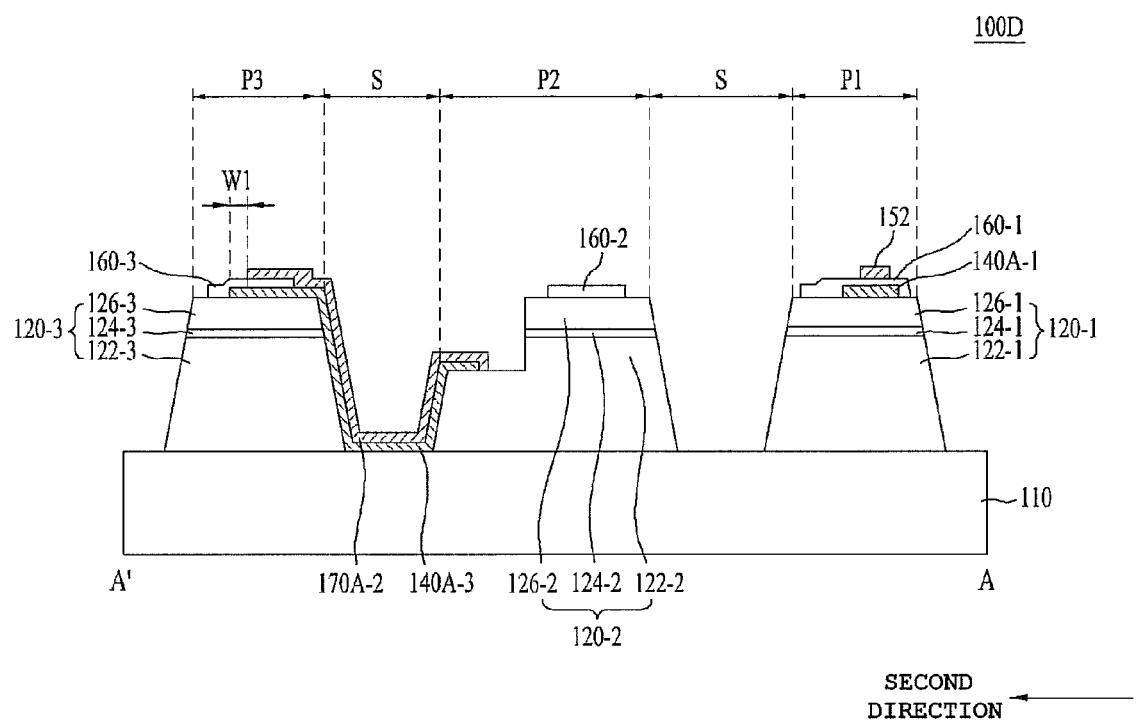
FIG. 8 is a sectional view taken along line A-A' of the light emitting device of FIG. 6.
Figure 9:
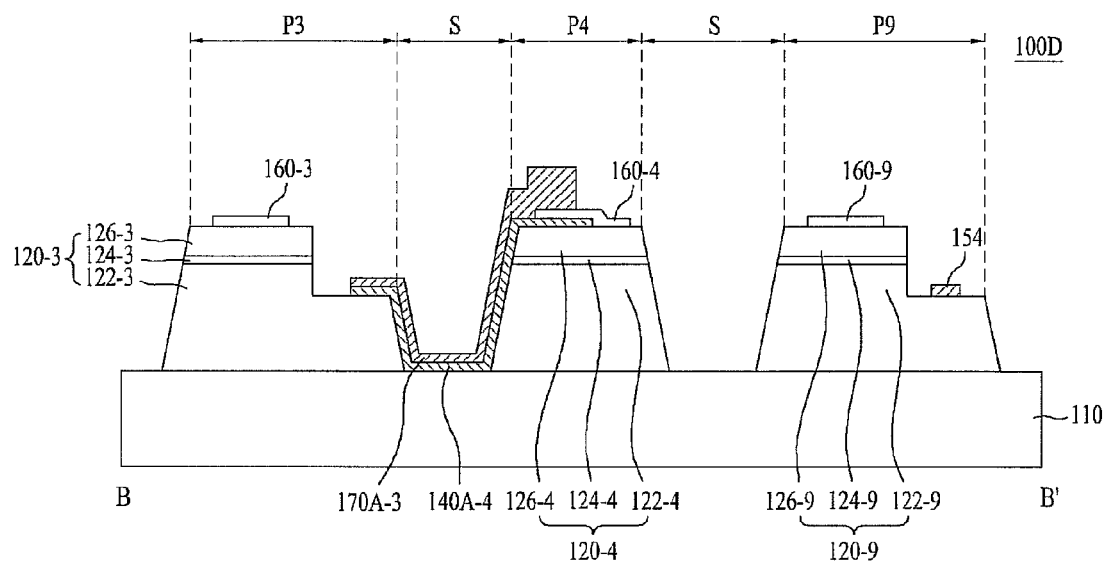
FIG. 9 is a sectional view taken along line B-B' of the light emitting device of FIG. 6.

FIG. 6 is a plan view of a light emitting device 100D according to another embodiment. FIG. 7 is an enlarged view of portion 'K' illustrated in FIG. 6. FIG. 8 is a sectional view taken along line A-A' of the light emitting device 100D of FIG. 6. FIG. 9 is a sectional view taken along line B-B' of the light emitting device 100D of FIG. 6.

Referring to FIGS. 6 to 9, the light emitting device 100D includes M light emitting regions (P1 to PM, M>1, wherein M is a natural number). Although FIGS. 6 to 9 illustrate the number M of light emitting regions as 9 for convenience of explanation, the following description may be applied in case that the number M of light emitting regions is less than 9 or exceed 9.

The light emitting device 100D includes the substrate 110, light emitting structures 120-1 to 120-9 respectively defined as light emitting regions P1 to P9, current blocking layers 140A-1 to 140A-9, integration layers 170A-1 to 170A-8, a first electrode 152, a second electrode 154, and conductive layers 160-1 to 160-9.

The substrate 110 and the light emitting structures 120-1 to 120-9 correspond to the substrate 110 and the light emitting structures 120a and 120b of FIG. 2 or 3, respectively, and thus a detailed description thereof will be omitted herein. The light emitting structures 120-1 to 120-9 respectively include lower semiconductor layers 122-1 to 122-9, active layers 124-1 to 124-9, and upper semiconductor layers 126-1 to 126-9 that respectively correspond to the lower semiconductor layers 122a and 122b, the active layers 124a and 124b, and the upper semiconductor layers 126a and 126b illustrated in FIGS. 2 and 3.

Hereinafter, a case in which each of the lower semiconductor layers 122-1 to 122-9 is an n-type semiconductor layer, and each of the upper semiconductor layers 126-1 to 126-9 is a p-type semiconductor layer will be described by way of example, but the disclosure is not limited thereto. That is, a case in which each of the lower semiconductor layers 122-1 to 122-9 is a p-type semiconductor layer, and each of the upper semiconductor layers 126-1 to 126-9 is an n-type semiconductor layer may also be applied.

The light emitting structures 120-1 to 120-9 formed as a single chip may be respectively defined as the light emitting regions P1 to P9 by boundary regions S. The boundary regions S may be regions located around the respective light emitting regions P1 to P9, e.g., the substrate 110. Areas of the light emitting regions P1 to P9 may be the same, but the disclosure is not limited thereto.

Each of the current blocking layers 140A-1 to 140A-9 is the same as the current blocking layer 140A illustrated in FIG. 2 and thus a detailed description thereof will be omitted herein. The only difference therebetween is the current blocking layer 140A-1 of the current blocking layers 140A-1 to 140A-9 does not serve as the passivation layer 60 and diffuses carriers towards the active layer 124-1 from the first electrode 152 and thus only serve as a contributor to enhancement of light intensity of the active layer 124-1.

Referring to FIGS. 6 and 8, the first electrode 152 is disposed on the upper semiconductor layer 126-1 of any one (e.g., P1) of the light emitting regions P1 to P9. The first electrode 152 may electrically contact the upper semiconductor layer 126-1 via the conductive layer 160-1. For example, the first electrode 152 may contact the conductive layer 160-1 of one (e.g., the first light emitting region P1) of the light emitting regions P1 to P9 connected in series. The first electrode 152 may be bonded to a wire (not shown) through which a first power is supplied.

Referring to FIGS. 6 and 9, the second electrode 154 is disposed on the lower semiconductor layer 122-9 of another (e.g., P9) of the light emitting regions P1 to P9 and may contact the lower semiconductor layer 122-9. The second electrode 154 may be bonded to a wire (not shown) through which a second power is supplied.

The integration layers 170A-1 to 170A-8 are respectively disposed on the current blocking layers 140A-2 to 140A-9 and electrically connect the light emitting regions P1 to P9 in series. For example, the integration layers 170A-1 to 170A-8 may connect the light emitting regions P1 to P9 in series. The starting point of this series connection is the first light region P1 where the first electrode 152 is located and the ending point of the series connection is the ninth light emitting region P9 where the second electrode 154 is located.

Each of the integration layers 170A-1 to 170A-8 corresponds to the integration layer 170A illustrated in FIG. 3 and thus a detailed description thereof will be omitted herein. Each integration layer, e.g., the integration layer 170A-1 may electrically connect the lower semiconductor layer 122-1 of any one (e.g., the first light emitting region P1) of adjacent ones (e.g., P1 and P2) of the light emitting regions P1 to P9 to the conductive layer 160-2 of the other (e.g., P2) thereof.

Referring to FIGS. 6 to 8, assuming that one (e.g., 140A-3) of the current blocking layers 140A-1 to 140A-9, disposed between one (e.g., 170A-2) of the integration layers 170A-1 to 170A-8 and an upper surface of one (e.g., 126-3) of the upper semiconductor layers 126-1 to 126-9 has an upper surface facing the integration layer 170A-2 and the integration layer 170A-2 has a lower surface facing the upper semiconductor layer 126-3, an area of the upper surface of the current blocking layer 140A-3 may be equal to or greater than an entire area of the lower surface of the integration layer 170A-2. Such configuration is provided so that the current blocking layer 140A-3 disposed between the integration layer 170A-2 and the upper semiconductor layer 126-3 blocks current by diffusing carriers supplied to the active layer 124-3 from the integration layer 170A-2. In this regard, the upper surface of the current blocking layer 140A-3 may be greater than the lower surface of the integration layer 170A-2. In this case, as illustrated in FIG. 7, the current blocking layer 140A-3 may have a greater width than that of the integration layer 170A-2 by d1+d2 in a first direction. In addition, as illustrated in FIG. 8, the current blocking layer 140A-3 may have a greater width than that of the integration layer 170A-2 by W1 in a second direction.

The series-connected light emitting regions P1 to P9 of the light emitting device 100D are referred to as, in numerical order, first, second, third, fourth, fifth, sixth, seventh, eighth, and ninth light emitting regions, respectively. That is, a light emitting region where the first electrode 152 is located is referred to as a first light emitting region P1, and a light emitting region where the second electrode 154 is located is referred to as a ninth light emitting region. The term "adjacent light emitting regions" as used herein refers to a k light emitting region and a k+1 light emitting region, and a k integration layer may electrically connect the k light emitting region and the k+1 light emitting region in series, wherein $1 \leq k \leq (M-1)$.

That is, the k integration layer may electrically connect a lower semiconductor layer 122-$k$ of the k light emitting region to a conductive layer 160-$(k+1)$ of the k+1 light emitting region. For example, referring to FIG. 8, the second integration layer 170A-2 may be formed in the second light emitting region P2, the third light emitting region P3, and the boundary region S therebetween. In addition, the second integration layer 170A-2 electrically connects the lower semiconductor layer 122-2 of the second light emitting region P2 to the upper semiconductor layer 126-3 of the third light emitting region P3 via the conductive layer 160-3 thereof.

In this regard, a k+1 current blocking layer 140A-$(k+1)$ may be disposed between the k integration layer 170A-k and the k lower semiconductor layer 122-$k$, between the k integration layer 170A-k and the substrate 110, between the k integration layer 170A-k and a k+1 lower semiconductor layer 122-$(k+1)$, between the k integration layer 170A-k and a k+1 active layer 124-$(k+1)$, and between the k integration layer 170A-k and a k+1 upper semiconductor layer 126-$(k+1)$ to electrically separate one from another.

Unlike the embodiment illustrated in FIG. 8 or 9, the current blocking layers 140A-1 to 140-9 may be embodied as the DBR 140B as illustrated in FIG. 3. In this case, light is not absorbed by the first electrode 152 and the integration layers 170A-1 to 170A-8 and thus light loss is prevented, whereby luminous efficacy may be enhanced.

Figure 10:
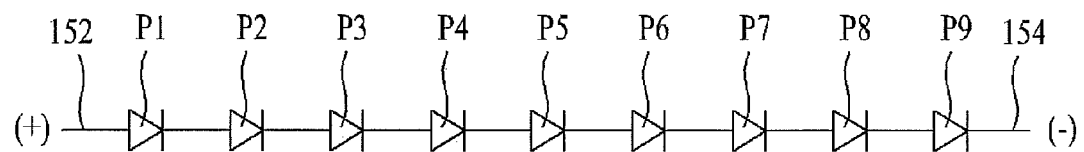
FIG. 10 is a circuit diagram of the light emitting device illustrated in FIG. 6.

FIG. 10 is a circuit diagram of the light emitting device 100D illustrated in FIG. 6.

Referring to FIGS. 6 and 10, the light emitting device 100D may have a single common positive (+) terminal 152 and a single common negative (−) terminal 154.

Figure 11:
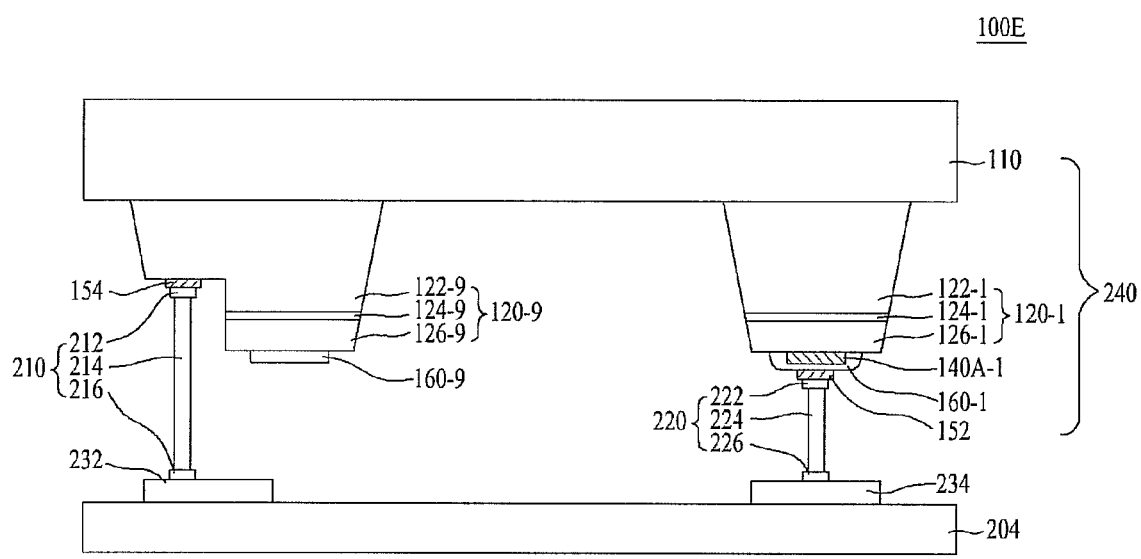
FIG. 11 is a sectional view of a light emitting device according to another embodiment.

FIG. 11 is a sectional view of a light emitting device 100E according to another embodiment.

Referring to FIG. 11, the light emitting device 100E includes a submount 204, a first metal layer 232, a second metal layer 234, a first bump unit 210, a second bump unit 220, and a light emitting device 240.

Although FIG. 11 illustrates the light emitting device 100E as having a flip-chip structure, the disclosure is not limited thereto. That is, the light emitting devices 100A, 100B and 100C may also have the flip-chip structure as illustrated in FIG. 11.

The light emitting device 240 is mounted on the submount 204. The submount 204 may be made of a package body, a printed circuit board, or the like and have various structures allowing the light emitting device 240 to be flip-chip bonded thereto.

The light emitting device 240 is disposed on the submount 204 and electrically connected to the submount 204 by the first bump unit 210 and the second bump unit 220. The light emitting device 240 of FIG. 11 has the same cross-section as that of the first and ninth light emitting regions P1 and P9 of the light emitting device 100D of FIG. 6 and thus a detailed description thereof will be omitted herein.

The submount 204 may include a resin such as polyphthalamide (PPA), liquid crystal polymer (LCP), polyimide (PA) 9T, or the like, a metal, a photosensitive glass, sapphire, ceramics, a printed circuit board, or the like, but the disclosure is not limited thereto.

The first and second metal layers 232 and 234 are disposed on the submount 204 to be spaced apart from each other in a horizontal direction. In this regard, an upper surface of the submount 204 may be a surface facing the light emitting device 240. The first and second metal layers 232 and 234 may be formed of a conductive metal, e.g., aluminum (Al) or rhodium (Rh).

The first and second bump units 210 and 220 are disposed between the submount 204 and the light emitting device 240. The first bump unit 210 may electrically connect the second electrode 154 to the first metal layer 232. The second bump unit 220 may electrically connect the first electrode 152 to the second metal layer 234.

The first bump unit 210 includes a first diffusion prevention adhesive layer 212, a first bumper 214, and a second diffusion prevention adhesive layer 216. The first bumper 214 is disposed between the second electrode 154 and the first metal layer 232. The first diffusion prevention adhesive layer 212 is disposed between the second electrode 154 and the first bumper 214 and adheres the second electrode 154 to the first bumper 214. That is, the first diffusion prevention adhesive layer 212 enhances adhesion between the first bumper 214 and the second electrode 154 and prevents ions contained in the first bumper 214 from permeating or diffusing into the light emitting structure 120-9 via the second electrode 154.

The second diffusion prevention adhesive layer 216 is disposed between the first bumper 214 and the first metal layer 232 and adheres the first bumper 214 to the first metal layer 232. The second diffusion prevention adhesive layer 216 enhances adhesion between the first bumper 214 and the first metal layer 232 and prevents ions contained in the first bumper 214 from permeating or diffusing into the submount 204 via the first metal layer 232.

The second bump unit 220 includes a third diffusion prevention adhesive layer 222, a second bumper 224, and a fourth diffusion prevention adhesive layer 226. The second bumper 224 is disposed between the first electrode 152 and the second metal layer 234.

The third diffusion prevention adhesive layer 222 is disposed between the first electrode 152 and the second bumper 224 and adheres the first electrode 152 to the second bumper 224. That is, the third diffusion prevention adhesive layer 222 enhances adhesion between the second bumper 224 and the first electrode 152 and prevents ions contained in the second bumper 224 from permeating or diffusing into the light emitting structure 120-1 via the first electrode 152.

The fourth diffusion prevention adhesive layer 226 is disposed between the second bumper 224 and the second metal layer 234 and adheres the second bumper 224 to the second metal layer 234. The fourth diffusion prevention adhesive layer 226 enhances adhesion between the second bumper 224 and the second metal layer 234 and prevents ions contained in the second bumper 224 from permeating or diffusing into the submount 204 via the second metal layer 234.

Each of the first, second, third and fourth diffusion prevention adhesive layers 212, 216, 222 and 226 may be formed of at least one of Pt, Ti, W/Ti, or Au or an alloy thereof. In addition, each of the first and second bumpers 214 and 224 may include at least one of titanium (Ti), copper (Cu), nickel (Ni), gold (Au), chromium (Cr), tantalum (Ta), platinum (Pt), or tin (Sn).

A plurality of light emitting devices according to one of the above-described embodiments may be disposed on a substrate as a light emitting device package, and an optical member such as a light guide plate, a prism sheet, a diffusion sheet, or the like may be disposed on an optical path of the light emitting device package. The light emitting device package, the substrate, and the optical member may function as a backlight unit.

According to another embodiment, the light emitting devices or light emitting device package according to the above-described embodiments may be applied to a display device, an indicating device, and a lighting system. For example, the lighting system may include lamps, street lamps, and the like.

Figure 12:
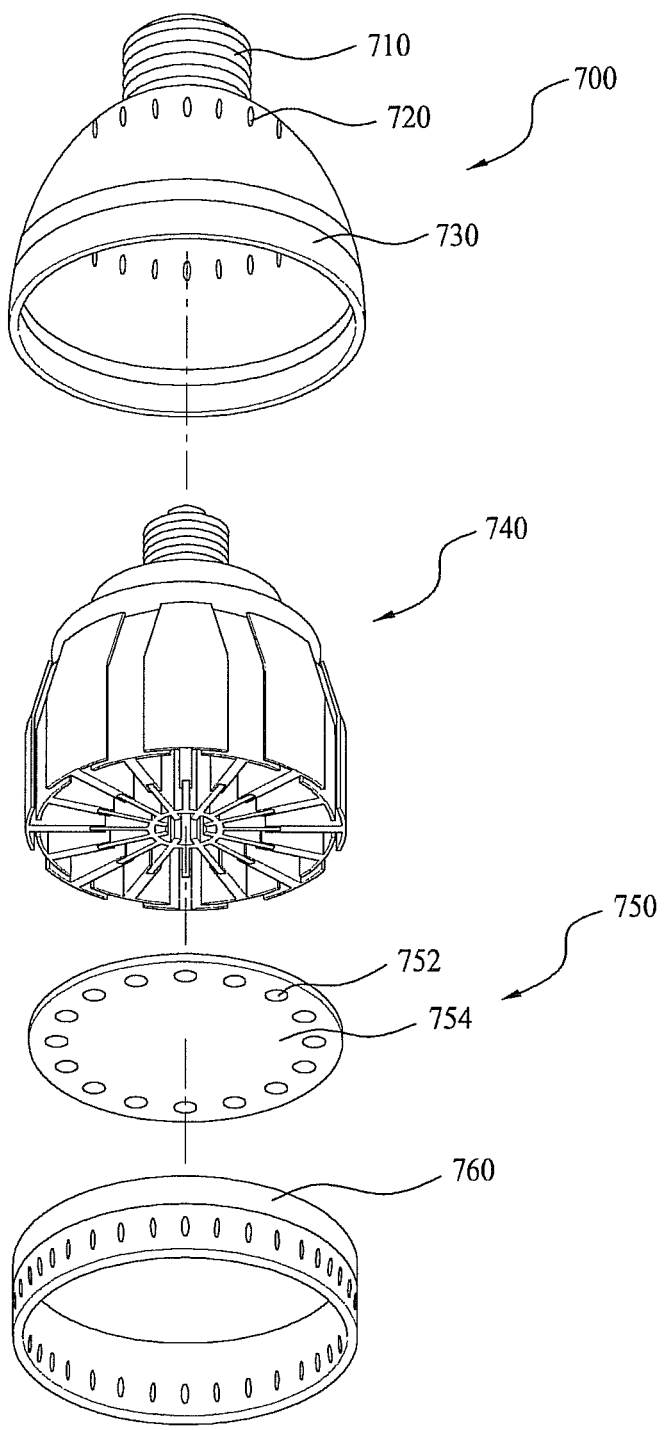
FIG. 12 is an exploded perspective view of a lighting device including light emitting device packages including the light emitting device according to one of the above-described embodiments.

FIG. 12 is an exploded perspective view of a lighting device including light emitting device packages including the light emitting device according to one of the above-described embodiments. Referring to FIG. 12, the lighting device includes a light source 750 to emit light, a housing 700 for accommodating the light source 750, a heat dissipation unit 740 for dissipating heat generated from the light source 750, and a holder 760 for coupling the light source 750 and the heat dissipation unit 740 to the housing 700.

The housing 700 includes a socket coupling unit 710 coupled to an electrical socket (not shown) and a body unit 730 connected to the socket coupling unit 710 and provided with the light source 750 accommodated therein. The body unit 730 may be provided with a single airflow hole 720 perforated therethrough.

In another embodiment, a plurality of airflow holes 720 may be formed in the body unit 730 of the housing 700. That is, the number of the airflow holes 720 may be at least one. The airflow holes 720 may be disposed in the body unit 730 in a radial form or various other forms.

The light source 750 includes a plurality of light emitting device packages 752 disposed on a substrate 754. The substrate 754 may have a shape allowing insertion into an opening of the housing 700 and be made of a material having a high thermal conductivity to transfer heat to the heat dissipation unit 740 as described below. The light emitting device packages may include the above-described light emitting device.

The light source 750 may be provided at a lower portion thereof with the holder 760, and the holder 760 may include a frame and other airflow holes. In addition, although not shown, the light source 750 may be provided at a lower portion thereof with an optical member to diffuse, scatter or converge light emitted from the light emitting device packages 752 of the light source 750.

Figure 13:
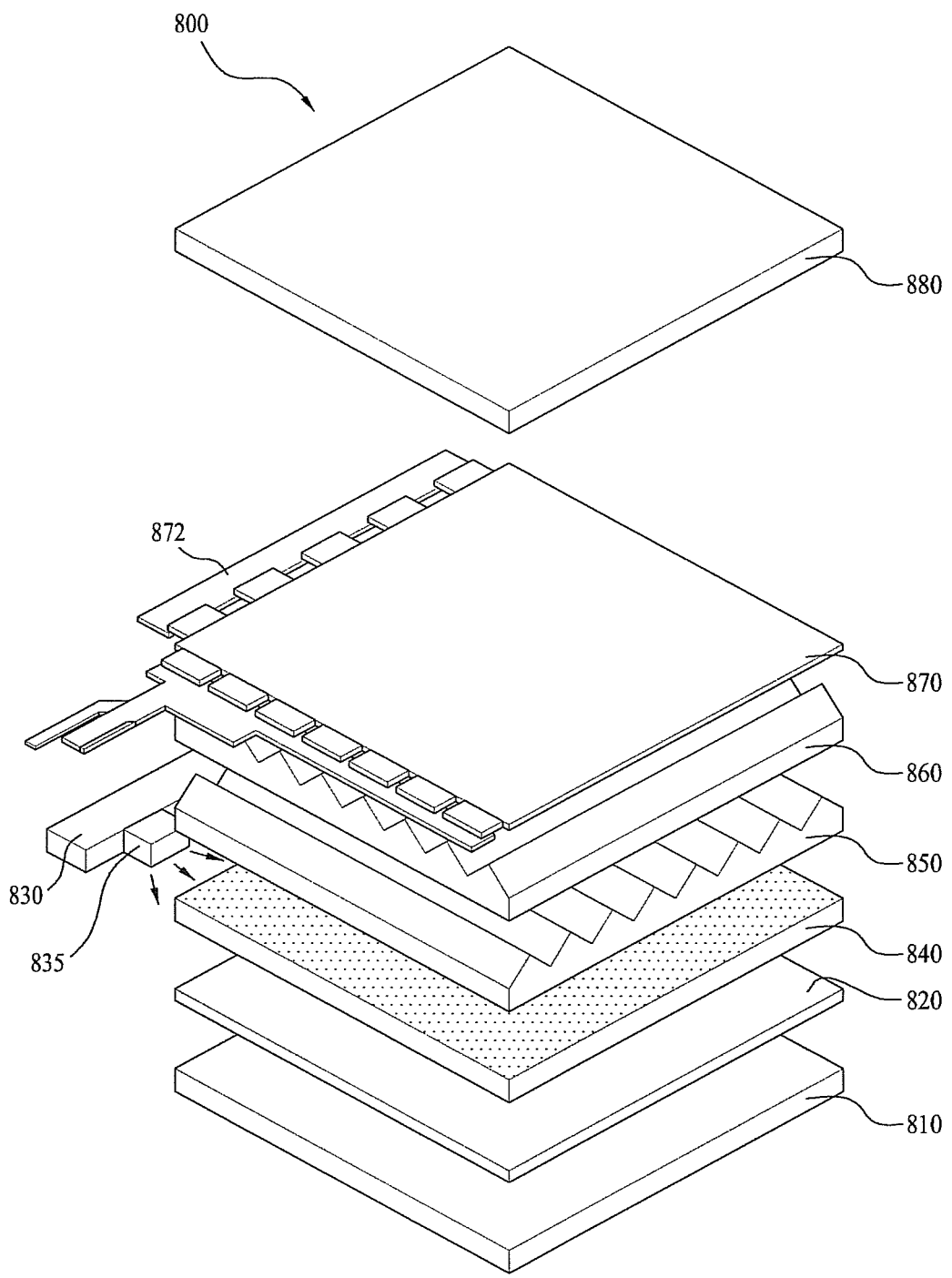
FIG. 13 is a view of a display device including light emitting device packages including the light emitting device according to one of the above-described embodiments.

FIG. 13 is a view of a display device 800 including light emitting device packages including the light emitting device according to one of the above-described embodiments.

Referring to FIG. 13, the display device 800 may include a bottom cover 810, a reflective plate 820 disposed on the bottom cover 810, a light emitting module including a substrate 830 and light emitting device packages 835 to emit light, a light guide plate 840 disposed at a front side of the reflective plate 820 and guiding light emitted from the light emitting module towards a front side of the display device 800, an optical sheet including prism sheets 850 and 860 disposed at a front side of the light guide plate 840, a display panel 870 disposed at a front side of the optical sheet, an image signal output circuit 872 connected to the display panel 870 and supplying an image signal to the display panel 870, and a color filter 880 disposed at a front side of the display panel 870. In this regard, the bottom cover 810, the reflective plate 820, the light emitting module 830, 835, the light guide plate 840, and the optical sheet may be realized as a backlight unit.

The light emitting module includes the light emitting device packages 835 on the substrate 830. In this regard, the substrate 830 may be a PCB or the like. The light emitting device packages 835 may include the light emitting device according to one of the above-described embodiments.

The bottom cover 810 may accommodate elements of the display device 800. The reflective plate 820 may be disposed as a separate element as illustrated in FIG. 13 or may be disposed by coating a material having a high reflectance on a rear surface of the light guide plate 840 or a front surface of the bottom cover 810.

In this regard, the reflective plate 820 may be made of a material having a high reflectance and enabling ultra-thin film fabrication, e.g., polyethylene terephthalate (PET).

The light guide plate 830 may be made of polymethylmethacrylate (PMMA), polycarbonate (PC), polyethylene (PE), or the like.

The first prism sheet 840 may include a support film and a layer of polymer with light transmission and elasticity, and the layer of polymer may include a prism layer in which a plurality of three-dimensional structures is repeated. In this regard, the structure patterns may be formed such that ridges and valleys are repeated in a stripe form as illustrated in FIG. 13.

A direction in which ridges and valleys at a surface of a support film of the second prism sheet 860 extend may be perpendicular to a direction in which the ridges and the valleys at the surface of the support film of the first prism sheet 850 extend. Such a configuration serves to uniformly disperse light transmitted from the light source module and the reflective plate 820 towards the entire surface of the display panel 870.

Although not shown, a diffusion sheet may be disposed between the light guide plate 840 and the first prism sheet 850. The diffusion sheet may be formed of a polyester or polycarbonate-based material and maximally increase a light projection angle through refraction and scattering of light incident from the backlight unit. In addition, the diffusion sheet may include a support layer including a light diffusing agent and first and second layers formed on a light emitting surface (in the direction of the first prism sheet 850) and a light incident surface (in the direction of the reflective plate 820) and excluding a light diffusing agent.

In the present embodiment, the diffusion sheet, the first prism sheet 850, and the second prism sheet 860 constitute an optical sheet. In another embodiment, the optical sheet may include other combinations, e.g., a micro lens array, a combination of a diffusion sheet and a micro lens array, a combination of a single prism sheet and a micro lens array, or the like.

The display panel 870 may include a liquid crystal display. In addition, the display panel 870 may include other types of display devices requiring a light source.

As is apparent from the above description, a light emitting device according to an embodiment includes a current blocking layer that serves as a passivation layer and thus a process of forming a passivation layer is not needed, thereby reducing manufacturing time and cost. In addition, the light emitting device includes a current blocking layer embodied as a distributed Bragg reflector and thus has increased reflection efficiency, whereby light extraction efficiency may be enhanced. Moreover, the light emitting device includes upper and lower electrodes and a conductive interconnection layer each of which does not include a reflection layer and thus has high corrosion resistance, which is suitable for use in exterior lighting devices. Embodiments provide a light emitting device with reduced manufacturing time and manufacturing cost and increased light extraction efficiency, which may be used in an exterior lighting device.

In one embodiment, a light emitting device includes a substrate, a plurality of light emitting cells disposed to be spaced apart from one another on the substrate in a horizontal direction, each of the light emitting cells including a light emitting structure including lower and upper semiconductor layers, conductive types of the lower and upper semiconductor layers being different from each other, and an active layer disposed between the lower and upper semiconductor layers, an upper electrode disposed on the upper semiconductor layer, and a lower electrode disposed on the lower semiconductor layer, a conductive interconnection layer configured to electrically connect a lower electrode of a first one of adjacent ones of the light emitting cells and an upper electrode of a second one of the adjacent light emitting cells, and a current blocking layer disposed so as to extend from between the upper electrode and the upper semiconductor layer of the second light emitting cell to between the adjacent light emitting cells and the conductive interconnection layer, wherein each of light emitting cells further includes a conductive layer disposed so as to extend from between the upper electrode of the second light emitting cell and the current blocking layer to on the upper semiconductor layer of the second light emitting cell and configured to electrically connect the upper electrode of the second light emitting cell to the upper semiconductor layer of the second light emitting cell.

The current blocking layer may be disposed between the lower semiconductor layer of the first light emitting cell and the conductive interconnection layer, between the substrate and the conductive interconnection layer, and between the light emitting structure of the second light emitting cell and the conductive interconnection layer.

The upper electrode of the second light emitting cell may have a lower surface facing the upper semiconductor layer of the second light emitting cell, and The current blocking layer disposed between the upper electrode and the upper semiconductor layer of the second light emitting cell may have an upper surface facing the upper electrode, wherein the upper surface of the current blocking layer has an area that is equal to or greater than an entire area of the lower surface of the upper electrode.

The upper electrode of the second light emitting cell, the lower electrode of the first light emitting cell, and the conductive interconnection layer may be formed as an integration layer.

The integration layer may have a lower surface facing the upper semiconductor layer of the second light emitting cell, and the current blocking layer disposed between the integration layer and the upper semiconductor layer of the second light emitting cell may have an upper surface facing the integration layer, wherein the upper surface of the current blocking layer has an area that is equal to or greater than an entire area of the lower surface of the integration layer.

The conductive layer disposed on the upper semiconductor layer may have an area that is equal to or less than an area of an upper portion of the upper semiconductor layer.

The conductive layer may be formed as a single layer or multiple layers using at least one of indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), $IrO_x$, $RuO_x$, $RuO_x$/ITO, Ni, Ag, Ni/$IrO_x$/Au, or Ni/$IrO_x$/Au/ITO.

The current blocking layer may include an electrically insulating material.

The current blocking layer may have a distributed Bragg reflector.

The distributed Bragg reflector may include first and second layers having different indexes of refraction alternately stacked at least once and an insulating material.

The upper electrode may include a first adhesive layer and a first bonding layer that overlap each other, and a reflection layer may not be provided between the first adhesive layer and the first bonding layer.

The upper electrode may further include a first barrier layer disposed between the first adhesive layer and the first bonding layer.

The lower electrode may include a second adhesive layer and a second bonding layer that overlap each other, and a reflection layer may not be provided between the second adhesive layer and the second bonding layer.

The lower electrode may further include a second barrier layer disposed between the second adhesive layer and the second bonding layer.

The light emitting cells may be connected in series by the conductive interconnection layer.

The conductive interconnection layer may include a third adhesive layer and a third bonding layer that overlap each other, and a reflection layer may not be provided between the third adhesive layer and the third bonding layer.

The conductive interconnection layer may further include a third barrier layer disposed between the third adhesive layer and the third bonding layer.

The conductive interconnection layer, the upper electrode, the conductive layer, and the current blocking layer may overlap one another in a vertical direction.

In another embodiment, a light emitting device includes a substrate, a plurality of light emitting cells disposed to be spaced apart from one another on the substrate in a horizontal direction, each of the light emitting cells including a light emitting structure including lower and upper semiconductor layers, conductive types of the lower and upper semiconductor layers being different from each other, and an active layer disposed between the lower and upper semiconductor layers, an upper electrode disposed on the upper semiconductor layer, and a lower electrode disposed on the lower semiconductor layer, a conductive interconnection layer configured to electrically connect a lower electrode of a first one of adjacent ones of the light emitting cells and an upper electrode of a second one of the adjacent light emitting cells, and a current blocking layer, wherein the current blocking layer includes a first portion disposed between the upper electrode and the upper semiconductor layer of the second light emitting cell and a second portion disposed so as to extend from the first portion to between the adjacent light emitting cells and the conductive interconnection layer, wherein each of the light emitting cells further includes a conductive layer configured to electrically connect the upper electrode of the second light emitting cell and the upper semiconductor layer of the second light emitting cell, and wherein the conductive layer includes a third portion disposed between the upper electrode of the second light emitting cell and the current blocking layer and a fourth portion disposed so as to extend from the third portion to on the upper semiconductor layer of the second light emitting cell.

The third portion of the conductive layer partially covers an upper surface of the first portion of the current blocking layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   first and second light emitting cells spaced apart from one another on the substrate in a horizontal direction, each including a light emitting structure having lower and upper semiconductor layers, conductive types of the lower and upper semiconductor layers being different from each other, an active layer disposed between the lower and upper semiconductor layers, an upper electrode on the upper semiconductor layer, and a lower electrode on the lower semiconductor layer;

a conductive interconnection layer configured to electrically connect a lower electrode of the first light emitting cell and an upper electrode of the second light emitting cell;

a current blocking layer disposed so as to extend from between the upper electrode of the second light emitting cell and the upper semiconductor layer of the second light emitting cell, and disposed between the light emitting structure of the second light emitting cell and the conductive interconnection layer to electrically separate the conductive interconnection layer from the light emitting structure of the second light emitting cell; and a conductive layer disposed so as to extend from between the upper electrode of the second light emitting cell and the current blocking layer to on the upper semiconductor layer of the second light emitting cell and configured to electrically connect the upper electrode of the second light emitting cell to the upper semiconductor layer of the second light emitting cell, wherein the upper electrode of the second light emitting cell has a lower surface facing the upper semiconductor layer of the second light emitting cell, the upper semiconductor layer of the second light emitting cell has a top surface facing the upper electrode of the second light emitting cell, and the current blocking layer is disposed between the lower surface of the upper electrode and the top surface of the upper semiconductor layer.

2. The light emitting device according to claim 1, wherein the current blocking layer is disposed between the lower semiconductor layer of the first light emitting cell and the conductive interconnection layer, between the substrate and the conductive interconnection layer, and between the light emitting structure of the second light emitting cell and the conductive interconnection layer.

3. The light emitting device according to claim 1, wherein the current blocking layer disposed between the upper electrode and the upper semiconductor layer of the second light emitting cell has an upper surface facing the upper electrode, and the upper surface of the current blocking layer having an area that is equal to or greater than an entire area of the lower surface of the upper electrode.

4. The light emitting device according to claim 1, wherein the upper electrode of the second light emitting cell, the lower electrode of the first light emitting cell, and the conductive interconnection layer are formed as an integration layer.

5. The light emitting device according to claim 4, wherein the integration layer has a lower surface facing the upper semiconductor layer of the second light emitting cell, and the current blocking layer disposed between the integration layer and the upper semiconductor layer of the second light emitting cell has an upper surface facing the integration layer, the upper surface of the current blocking layer having an area that is equal to or greater than an entire area of the lower surface of the integration layer.

6. The light emitting device according to claim 1, wherein the conductive layer disposed on the upper semiconductor layer has an area that is equal to or less than an area of an upper portion of the upper semiconductor layer.

7. The light emitting device according to claim 1, wherein the conductive layer is formed as a single layer or multiple layers using at least one of indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrOx, RuOx, RuOx/ITO, Ni, Ag, Ni/IrOx/Au, or Ni/IrOx/Au/ITO.

8. The light emitting device according to claim 1, wherein the current blocking layer comprises an electrically insulating material.

9. The light emitting device according to claim 8, wherein the current blocking layer has a distributed Bragg reflector.

10. The light emitting device according to claim 9, wherein the distributed Bragg reflector comprises first and second layers having different indexes of refraction alternately stacked at least once and an insulating material.

11. The light emitting device according to claim 1, wherein the upper electrode comprises a first adhesive layer and a first bonding layer that overlap each other, a reflection layer not being provided between the first adhesive layer and the first bonding layer.

12. The light emitting device according to claim 11, wherein the upper electrode further comprises a first barrier layer disposed between the first adhesive layer and the first bonding layer.

13. The light emitting device according to claim 1, wherein the lower electrode comprises a second adhesive layer and a second bonding layer that overlap each other, a reflection layer not being provided between the second adhesive layer and the second bonding layer.

14. The light emitting device according to claim 13, wherein the lower electrode further comprises a second barrier layer disposed between the second adhesive layer and the second bonding layer.

15. The light emitting device according to claim 1, wherein the light emitting cells are connected in series by the conductive interconnection layer.

16. The light emitting device according to claim 1, wherein the conductive interconnection layer comprises a third adhesive layer and a third bonding layer that overlap each other, a reflection layer not being provided between the third adhesive layer and the third bonding layer.

17. The light emitting device according to claim 16, wherein the conductive interconnection layer further comprises a third barrier layer disposed between the third adhesive layer and the third bonding layer.

18. The light emitting device according to claim 1, wherein the conductive interconnection layer, the upper electrode, the conductive layer, and the current blocking layer overlap one another in a vertical direction.

19. A light emitting device, comprising:
a substrate;
a plurality of light emitting cells disposed to be spaced apart from one another on the substrate in a horizontal direction, each of the light emitting cells including:
a light emitting structure including:
lower and upper semiconductor layers, conductive types of the lower and upper semiconductor layers being different from each other; and
an active layer disposed between the lower and upper semiconductor layers;
an upper electrode disposed on the upper semiconductor layer; and
a lower electrode disposed on the lower semiconductor layer;
a conductive interconnection layer configured to electrically connect a lower electrode of a first one of adjacent ones of the light emitting cells and an upper electrode of a second one of the adjacent light emitting cells; and
a current blocking layer disposed between the light emitting structure of the second one of the adjacent light emitting cells and the conductive interconnection layer to electrically separate the conductive interconnection layer from the light emitting structure of the second one of the adjacent light emitting cells, wherein the current blocking layer includes a first portion disposed between a bottom surface of the upper electrode and a top surface of the upper semiconductor layer of the second light emitting cell; and a second portion disposed so as to extend from the first portion to between the adjacent light emitting cells and the conductive interconnection layer, wherein each of the light emitting cells further includes a conductive layer configured to electrically connect the upper electrode of the second light emitting cell and the upper semiconductor layer of the second light emitting cell, and wherein the conductive layer includes a third portion disposed between the upper electrode of the second light emitting cell and the current blocking layer; and a fourth portion disposed so as to extend from the third portion to on the upper semiconductor layer of the second light emitting cell.

20. The light emitting device according to claim 19, wherein the third portion of the conductive layer partially covers an upper surface of the first portion of the current blocking layer.

* * * * *